United States Patent [19]
Pond

[11] Patent Number: 5,943,223
[45] Date of Patent: Aug. 24, 1999

[54] ELECTRIC SWITCHES FOR REDUCING ON-STATE POWER LOSS

[75] Inventor: Robert J. Pond, Doylestown, Ohio

[73] Assignee: Reliance Electric Industrial Company, Cleveland, Ohio

[21] Appl. No.: 08/951,174

[22] Filed: Oct. 15, 1997

[51] Int. Cl.$^6$ .................................................. H02M 3/335
[52] U.S. Cl. ................................ 363/21; 363/50; 363/53; 363/56
[58] Field of Search ................................ 363/147, 50, 53, 363/56, 21; 327/385; 388/837

[56] References Cited

U.S. PATENT DOCUMENTS

| | | |
|---|---|---|
| 2,505,115 | 4/1950 | Hills et al. . |
| 3,276,023 | 9/1966 | Dorne et al. . |
| 3,339,205 | 8/1967 | Smitka et al. . |
| 3,959,794 | 5/1976 | Chrepta et al. . |
| 3,983,477 | 9/1976 | Stuchly et al. . |
| 4,227,147 | 10/1980 | Miller . |
| 4,563,251 | 1/1986 | Becker et al. . |
| 4,625,176 | 11/1986 | Champion et al. . |
| 4,635,181 | 1/1987 | Bourgeauh . |
| 4,658,162 | 4/1987 | Koyama et al. . |
| 4,658,227 | 4/1987 | Howell et al. . |
| 4,661,212 | 4/1987 | Ehrfeld et al. . |
| 4,674,180 | 6/1987 | Zavracky et al. . |
| 4,677,332 | 6/1987 | Heyraud . |
| 4,698,285 | 10/1987 | Ehrfeld et al. . |
| 4,698,607 | 10/1987 | Howell . |
| 4,700,256 | 10/1987 | Howell . |
| 4,705,923 | 11/1987 | Howell . |
| 4,717,796 | 1/1988 | Howell . |
| 4,717,798 | 1/1988 | Howell . |
| 4,725,701 | 2/1988 | Howell . |
| 4,730,242 | 3/1988 | Divan . |
| 4,738,010 | 4/1988 | Ehrfeld et al. . |
| 4,740,410 | 4/1988 | Muller et al. . |
| 4,744,863 | 5/1988 | Guckel et al. . |
| 4,754,185 | 6/1988 | Gabriel et al. . |

(List continued on next page.)

OTHER PUBLICATIONS

J. Jason Yao and Frank Chang, "A Surface Micromachined Miniature Switch For Telecommunications Applications With Signal Frequencies From DC Up to 4 GHZ" In Tech Digest, Jun. 25–29; pp. 384–387.

Harold Joseph and Steve Terry and Roger H. Grace, "MEMS Technology Is Poised For Wide–Scale Commercialization" Electronic Design, May 27, 1997.

"MEMS Technology Pursued For The Development Of Micromachined Silicon Variable Inductors And Latching Accelerometers" Electronic Design, Jun. 23, 1997.

Sid Marshall, "MEMS Technologies–On The Brink Of Maturity?" R&D Magazine, Jul. 1997.

"Tech Files" Electronic Engineering Times, Jun. 16, 1997.

*Primary Examiner*—Shawn Riley
*Attorney, Agent, or Firm*—Joseph N. Ziebert; John M. Miller; John J. Horn

[57] ABSTRACT

A power application circuit utilizes microelectromechanical (MEM) switches to reduce power loss in energy conversion equipment. The MEM switches can be integrated on a single substrate with a diode or semiconductor switch. The MEM switches can be included in a single circuit package with another semiconductor device and may include a control circuit which turns each MEM switch on or off. The MEM switch is controlled so that it is opened and closed only when a relatively low voltage drop occurs across the switch. The MEM switch can be utilized in AC to AC converters, DC to AC converters, AC to DC converters, matrix converters, motor controllers, resonant motor controllers, or other power application devices. The MEM switch can also be included in a single package with an IGBT which is optimized for low-switching losses. It can be included in a single package with a diode to reduce conduction loss in power diode bridges.

42 Claims, 11 Drawing Sheets

U.S. PATENT DOCUMENTS

| | | |
|---|---|---|
| 4,773,721 | 9/1988 | Erman et al. . |
| 4,784,935 | 11/1988 | Ehrfeld et al. . |
| 4,797,211 | 1/1989 | Ehrfeld et al. . |
| 4,808,549 | 2/1989 | Mikkor et al. . |
| 4,818,050 | 4/1989 | Duthie . |
| 4,835,461 | 5/1989 | Snelling . |
| 4,853,639 | 8/1989 | Vosteen et al. . |
| 4,853,669 | 8/1989 | Guckel et al. . |
| 4,855,671 | 8/1989 | Fernandes . |
| 4,864,483 | 9/1989 | Divan . |
| 4,893,509 | 1/1990 | MacIver et al. . |
| 4,895,500 | 1/1990 | Hok et al. . |
| 4,896,098 | 1/1990 | Haritonidis et al. . |
| 4,943,750 | 7/1990 | Howe et al. . |
| 4,990,827 | 2/1991 | Ehrfeld et al. . |
| 4,996,082 | 2/1991 | Guckel et al. . |
| 4,997,521 | 3/1991 | Howe et al. . |
| 5,013,693 | 5/1991 | Guckel et al. . |
| 5,013,954 | 5/1991 | Shibaike et al. . |
| 5,028,875 | 7/1991 | Peters . |
| 5,043,043 | 8/1991 | Howe et al. . |
| 5,044,745 | 9/1991 | Inoue et al. . |
| 5,054,522 | 10/1991 | Kowanz et al. . |
| 5,072,288 | 12/1991 | MacDonald et al. . |
| 5,093,594 | 3/1992 | Mehregany . |
| 5,095,401 | 3/1992 | Zavracky et al. . |
| 5,099,406 | 3/1992 | Harada et al. ............................ 363/20 |
| 5,121,089 | 6/1992 | Larson . |
| 5,129,983 | 7/1992 | Greiff . |
| 5,140,257 | 8/1992 | Davis . |
| 5,146,233 | 9/1992 | Ursenbach . |
| 5,155,620 | 10/1992 | Gordon et al. . |
| 5,177,595 | 1/1993 | Beatty . |
| 5,191,251 | 3/1993 | Paratte . |
| 5,206,983 | 5/1993 | Guckel et al. . |
| 5,231,359 | 7/1993 | Masuda et al. . |
| 5,262,932 | 11/1993 | Stanley et al. ............................ 363/26 |
| 5,696,491 | 12/1997 | White et al. ............................ 340/657 |

ELECTRIC SWITCHES FOR REDUCING ON-STATE POWER LOSS

FIELD OF THE INVENTION

The present invention relates to a method and to an apparatus for reducing loss in power conversion circuits and in power applications devices, such as, motor control circuits, power supplies, DC (direct current) to DC converters, rectifying circuits, AC (alternating current) to AC converters, DC to AC converters, matrix converters, and other power application circuits. More particularly, the present invention relates to a method and to an apparatus for reducing power loss in power application devices by utilizing a microelectromechanical (MEM) switch.

BACKGROUND OF THE INVENTION

In power application circuits, semiconductor devices are typically utilized to convert, apply, and remove electrical power. Conventional semiconductor devices are capable of switching (e.g., turning on and off) at high speeds (e.g., high frequency) and are capable of linearly controlling the application of electrical power to a load. Semiconductor devices can include diodes, insulated gate bipolar transistors (IGBTs), thyristors, silicon-controlled rectifiers (SCRs), field effect transistors (FETs), bipolar transistors, semiconductor switches, and combinations thereof. Power application circuits can perform a variety of operations, such as, controlling motors and generators, generating power, transmitting power, converting power, discharging and charging capacitors, dissipating power, disconnecting power, connecting power, or high voltage and high current functions.

Unlike conventional electromechanical switches (e.g., electromagnetic contactors, relays, and reed switches), the semiconductor devices can advantageously switch, or turn on or off, at high speeds (e.g., over several kilohertz, KHz). However, semiconductor devices generally have a power loss greater than conventional electromechanical switches. The power loss occurs when the device is conducting current (e.g., is in a conduction state) and when the device is switched (e.g., during switching to or from the conduction state). The power loss, $P_{loss}$, is typically dissipated as heat and can be represented by the following equation:

$$P_{loss}=IV_d+I^2R_{on}+KV_sI_sF$$

where: I=the current through the semiconductor device when the device is in a conduction state;

Rm=the conduction resistance of the semiconductor device;

$V_d$=the ON state voltage drop associated with the device when it is in the conduction state;

$V_s$=the voltage across the semiconductor device during switching;

$I_s$=the current through the semiconductor device during switching;

K=a constant related to characteristics of the device; and

F=the frequency at which the semiconductor device is switched.

The term $KV_sI_sF$ represents the switching losses, and the sum of the terms $I^2R_{on}$ and $IV_d$ represents the conduction losses. Thus, in power applications where the terms I, $V_s$, and F can be quite large, a considerable amount of electrical power is consumed when the semiconductor device is switching and conducting.

The power loss associated with semiconductor devices can be as large as 5% of the rated power output of the power application circuit. For example, in conventional motor drives, IGBTs transform input voltages into switched output voltages, which are applied to a motor to create desired torque and speed. The IGBTs can have a power loss of about 5% of the rated power of the motor, depending upon the size of the motor. This large power loss is a particularly important design constraint because the drive must be designed to limit the temperature rise in the devices and in the motor drive. Silicon junctions associated with the semiconductor devices, such as, IGBTs, cannot have a temperature which exceeds approximately 125° C. Therefore, the design of motor drives must include significant cooling apparatus, such as, large heat sinks and blowers, to maintain the semiconductor devices at a moderate temperature. Heat sinks and blowers add considerably to the size, weight, and cost of the motor drive. Thus, large power losses due to the semiconductor devices must be accommodated in conventional power application circuits.

Semiconductor devices can be designed either to reduce switching losses at the expense of increasing conduction losses or to reduce conduction losses at the expense of increasing switching losses. For example, switching losses in IGBTs can be reduced by lowering the lifetime of charge carriers in the channel region. The lifetime can be lowered by a number of processes, such as, irradiating the IGBT with an electron beam or doping epitaxial layers of the IGBT with metallic substances (e.g., gold or platinum). However, reducing the lifetime of the charge carriers tends to increase the conduction losses associated with the IGBT. Despite the optimization of semiconductor devices to have conduction losses and switching losses for particular power application criteria, power application circuits still have high power losses due to the use of semiconductor devices.

Conventional electromagnetic switches which have low conduction losses cannot be utilized in many power application circuits because the electromagnetic switches are too slow. For instance, conventional electromagnetic switches cannot be utilized in AC to AC, DC to DC, AC to DC, and DC to AC power conversion circuits because these circuits often require that the switch be turned on and off thousands of times per second (e.g., in the kilohertz (KHz) range). Additionally, power application circuits often require fast actuation speeds (e.g., that the switch be opened or closed in a small amount of time).

Some conventional electromagnetic switches have been utilized in parallel with IGBTs in AC and DC motor drives to directly connect the power source to the motor, once the motor has reached (e.g., ramped up to) an operating speed. However, the IGBTs still are responsible for high power losses as the motor is ramped up, slowed down, or otherwise controlled by the IGBTs. Further, this scheme cannot be utilized in power inverter applications.

Some conventional relay switches have been included in an inverter bypass kit. The relay switch shorts out the inverter to reduce power loss. Other conventional relay switches have been used to short out FETs on high power digital output cards. However, these relay switches cannot operate at high frequencies. Thus, conventional electromagnetic switches or relay switches do not solve the power loss problem associated with semiconductor devices in power application circuits.

Additionally, conventional electromechanical switches can be inappropriate for use in power conversion and application circuits because of the many cycles of operation which they must perform during the life of power conversion and application circuits. For example, during the 20-year life of a power conversion circuit, the switch in a power application circuit can perform over 6 trillion cycles. The performance of electromagnetic switches can degrade and wear over the lifetime due to the mechanical nature of the switches. Further, in high power applications, conventional electromagnetic switches can be prone to arcing, which provides additional wear (e.g. contact erosion) on the mechanical switches which in many cases increases or generates resistance across the switch contacts.

Thus, there is a need for a power conversion circuit which has reduced power loss. Further still, there is a need for electromechanical switches which are capable of switching at high frequencies. Even further still, there is a need for a power conversion circuit which can utilize electromechanical switches. Yet further, there is a need for an integrated circuit package which includes an apparatus for reducing power loss in a semiconductor device.

SUMMARY OF THE INVENTION

The present invention relates to a power conversion circuit that includes an array of microelectromechanical switches with a power input and a power output and a control circuit. Each of the switches has an input signal terminal, an output signal terminal, and a control terminal. The control circuit is coupled to the array of switches. The control circuit provides a control signal to the control terminal of each of the switches in the array. The control circuit controls operation of the switches. Each of the switches electrically connects the input signal terminal to the output signal terminal in response to the control signal provided by the control circuit. The array of the switches converts a power signal provided to the power input and provides a converted power signal at the power output.

The present invention further relates to a power application circuit that includes a semiconductor device, a microelectromechanical switch coupled in parallel with the semiconductor device, and a control circuit that is coupled to the microelectromechanical switch. The control circuit opens and closes the switch when a magnitude of voltage across the switch is below a threshold, thereby reducing arcing in the microelectromechanical switch.

The present invention still further relates to a method of reducing conduction losses in a power application circuit that includes a power semiconductor device and a microelectromechanical switch in parallel with the power semiconductor device. The method includes closing the switch when the magnitude of voltage across the semiconductor switch is below a threshold and opening the switch before the magnitude of the voltage across the switch rises above the threshold.

The present invention even further relates to an integrated circuit package that includes a semiconductor device, a first terminal, a second terminal, and a microelectromechanical switch. The switch and the semiconductor device are coupled between the first terminal and the second terminal. The switch is controlled by a switch control signal. The switch reduces the conduction losses associated with the semiconductor device.

The present invention relates to a rectifier circuit that includes a power input, at least one semiconductor device coupled to the power input, a microelectromechanical switch coupled in parallel with the semiconductor device, and a control circuit. The semiconductor device rectifies a power signal at the power input. The microelectromechanical switch includes a control input. The control circuit is coupled to the control input and provides a control signal to the control input. The control circuit provides the control signal to the control input so the switch is opened and closed when a magnitude of voltage across the switch meets a predetermined condition.

The present invention also relates to a motor control circuit that includes a power input, a power output, at least one semiconductor device coupled to the power input, a microelectromechanical switch coupled in parallel with the semiconductor device, and a switch control circuit. The semiconductor device supplies a power signal at the power input to the power output. The switch control circuit is coupled to the switch and opens and closes the switch when the magnitude of voltage across the switch meets a predetermined condition.

The present invention yet further relates to a motor control circuit that includes a power input, a power bus, a resonant circuit coupled to the power input, a power output, a plurality of first motor control microelectromechanical switches coupled to the power bus, and a control circuit coupled to the motor control microelectromechanical switches. The resonant circuit provides a power signal to the power bus. The power signal has a signal voltage portion and a substantially low voltage portion. The control circuit opens and closes the switches during the substantially low voltage portion of the power signal.

In one aspect of the present invention, conduction losses associated with power application circuits, including power conversion circuits, are reduced by providing a microelectromechanical (MEM) switch in place of, or in parallel with, a semiconductor device. The MEM switch can be a normally opened or a normally closed switch. Furthermore, the MEM switch can include a control terminal for receiving a control signal which opens and closes the switch. An internal or an external control circuit provides the control signal so the switch is opened and closed when the voltage across the switch is below a threshold, such as, a low voltage threshold of five volts. In this way, the MEM switch is protected from problems associated with a high voltage environment, such as, arcing.

In accordance with yet another exemplary aspect of the present invention, a single integrated circuit package includes a semiconductor device and a microelectromechanical (MEM) switch coupled in parallel. High voltage switching across the package is handled by the IGBT, and the conduction current is handled by the MEM switch. When the voltage has collapsed to an ON state value of a few volts (e.g., 0–10 volts) or other lower voltage threshold, the MEM switch is activated to conduct the current across the parallel combination, The semiconductor device is in a conduction state before the MEM switch is opened and closed. Preferably, a large number of MEM switches are provided in parallel to handle the large current associated with power applications.

In accordance with yet a further exemplary aspect of the present invention, the MEM switch on the device is provided in parallel with an IGBT. The IGBT is optimized to have the lowest possible switching losses at the expense of having high conduction losses. However, the high conduction losses are reduced by shorting the IGBT with the MEM device when the IGBT is conducting.

In accordance with still a further exemplary aspect of the present invention, MEM switches can be utilized in various power applications, including power conversion circuitry, motor controllers, generators, and other power application devices. For example, MEM switches can be utilized in motor controllers, motor drives, DC to DC converters, AC to AC converters, DC to AC converters, matrix converters, and AC to DC converters.

BRIEF DESCRIPTION OF THE DRAWINGS

The invention will hereinafter be described with reference to the accompanying drawings wherein like numerals denote like elements, and.

DETAILED DESCRIPTION OF PREFERRED EXEMPLARY EMBODIMENTS

Figure 1:
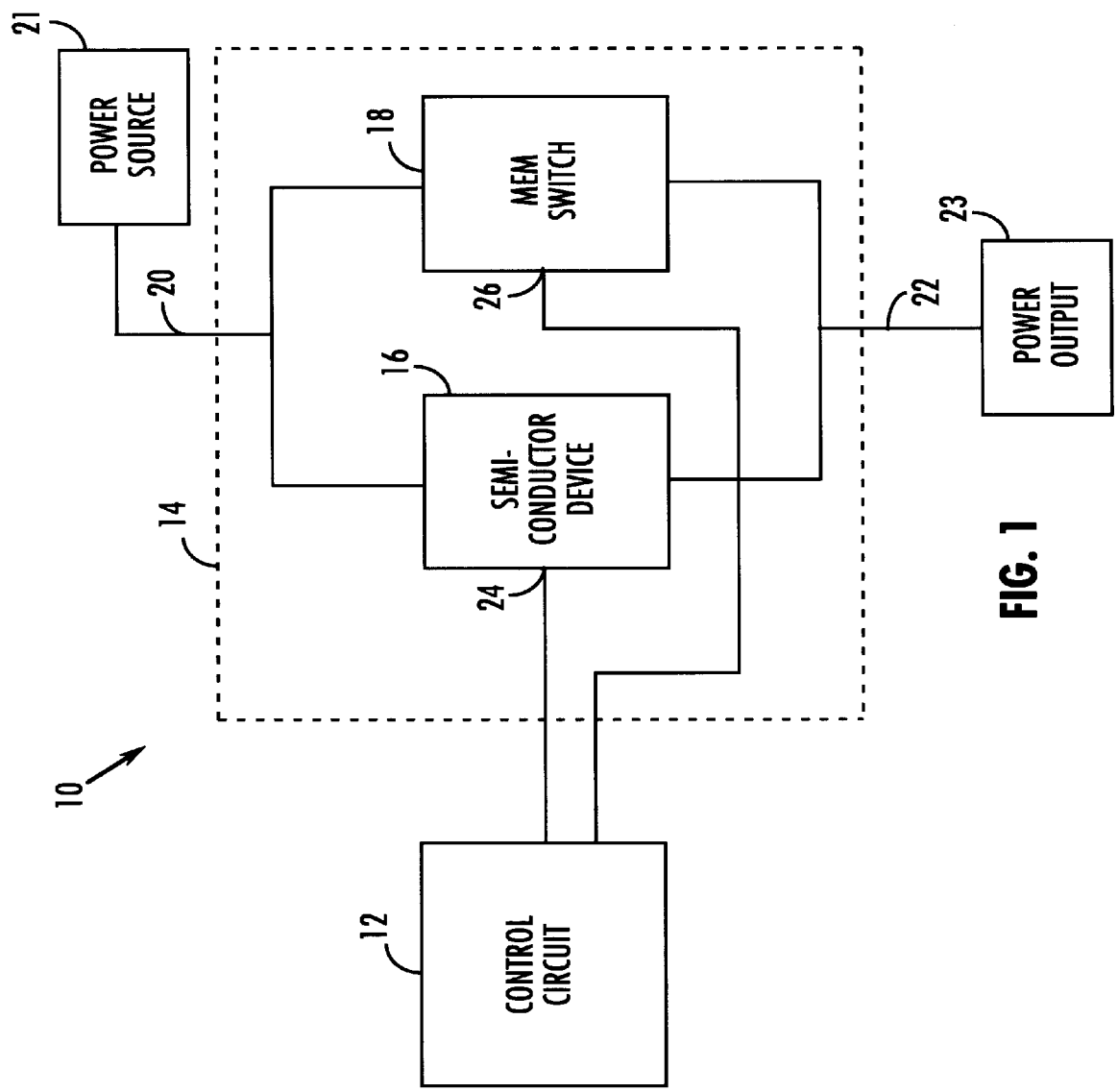
FIG. 1 is a general schematic block diagram of a power application system, including a semiconductor device and a microelectromechanical (MEM) switch, in accordance with an exemplary embodiment of the present invention.

With reference to FIG. 1, a power application system 10 includes a control circuit 12 and a switch apparatus 14. Switch apparatus 14 includes a semiconductor device 16 and a microelectromechanical (MEM) switch 18. Device 16 and switch 18 are coupled in parallel between a node or a terminal 20 and a node or a terminal 22.

Semiconductor device 16 can have a control node or terminal 24. Alternatively, semiconductor device 16 does not include a control terminal and is a two-terminal semiconductor device. MEM switch 18 also includes a control terminal 26. Control terminals 24 and 26 are coupled to control circuit 12.

Semiconductor device 16 can be a diode, an insulated gate bipolar transistor (IGBT), an IGBT with a parallel diode, a silicon-controlled rectifier (SCR), a field effect transistor (FET), a bipolar transistor, a rectifier, other semiconductor switch, or combinations thereof. Semiconductor device 16 can be a two-terminal, a three-terminal, or more than a three-terminal solid state device.

System 10 can be any power application circuit, device, or portion thereof for applying or converting electrical power signals. System 10 can be a portion of a conversion circuit, such as, an alternating current (AC)-AC converter, a direct current (DC)-DC converter, a rectifying circuit, a DC to AC converter, an AC to AC converter, a switch matrix system, a motor controller, a motor drive, a power supply, or other power application circuit. Terminal 20 can be coupled to a power source 21 which provides high voltage AC or DC power signals, such as 120 V, 240, 480, or 600 V signals. Alternatively, power source 21 can provide a 24 V signal at 400 Hz, such as in an aircraft power system. Terminal 22 can be coupled to a power output which provides high frequency (e.g., over 1 KHz), high voltage (e.g., over 120 V) power to an appliance, motor, or other high voltage device. Alternatively, system 10 can convert lower voltage signals and provide lower voltage outputs.

Apparatus 14 can be implemented in a single integrated circuit package or on a single integrated circuit substrate or semiconductor base. Apparatus 14 can have only a single control input and can include an internal control circuit for deriving separate control signals for device 16 and for switch 18. Control circuit 12 can be integrated within apparatus 14 and thus, internally provide control signals to terminals 24 and 26.

MEM switch 18 can be any miniature switch having contacts which are mechanically opened and closed. The contacts can be opened and closed based upon electromagnetic or electro static principles. For instance, MEM switch 18 can be a micromachined miniature switch disposed on a semiconductor substrate, such as, silicon or glass substrate. Switch 18 can use a suspended silicon dioxide microbeam as a cantilevered arm which connects platinum-to-gold electric contacts in response to electro static actuation. Switch 18 can be a microelectromechanical switch device or microelectromechanical system (MEMS), where a polysilicon paddle overlays the trench. The polysilicon paddle is electrostatically actuated to deform and to connect to a contact provided on a glass cap wafer disposed over the trench. Switch 18 can also be a microelectronic switch having a configuration similar to a FET. The term microelectromechanical switch or MEM switch refers to any small-scale switch which mechanically moves and operates at switching frequencies greater than conventional electromechanical and electromagnetic devices (e.g. the MEM switch operates from 1 to 30 KHz, and typically 10 KHz).

Figure 2:
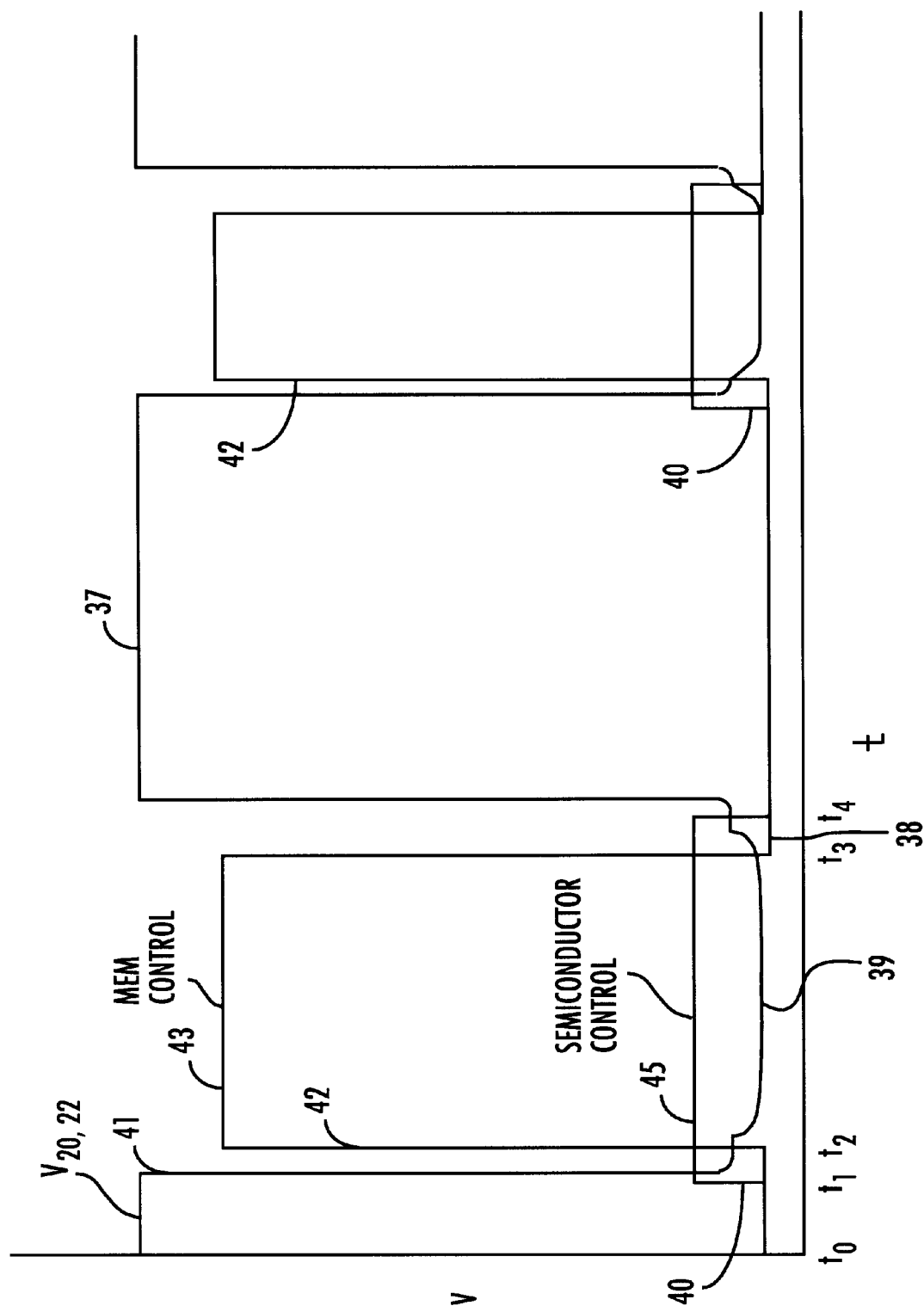
FIG. 2 is a timing diagram showing a semiconductor device control signal, a MEM switch control signal, and a voltage across the MEM switch for the power application system illustrated in FIG. 1.

With reference to FIGS. 1 and 2, the operation of power application system 10 is discussed as follows. Control circuit 12 opens and closes a first current path between terminals 20 and 22 through device 16 by providing a control signal 40 (FIG. 2) to control terminal 24. Control circuit 12 opens and closes a second current path between terminals 20 and 22 through switch 18 by providing a control signal 42 to control terminal 26.

Semiconductor device 16 provides the first path between terminal 20 and terminal 22 in response to signal 40 being above a threshold voltage associated with the particular semiconductor device 16. When a pulse 45 (FIG. 2) on signal conductor 40 is provided at time $t_1$ to terminal 24, device 16 can enter a conduction state. For example, if semiconductor device 16 is an IGBT, control circuit 12 provides voltage 15 at terminal 24 to cause device 16 to conduct between terminals 20 and 22.

Once device 16 is conducting and a voltage 41 (FIG. 2) between terminals 20 and 22 is relatively low (e.g., on-state voltage drop 39 of device 16), control circuit 12 provides a voltage or pulse 43 on control signal 42 at time $t_2$ to terminal 26. Preferably, control circuit 12 provides a leading edge of pulse 43 approximately 2 to 10 micro seconds and preferably 4 microseconds after the leading edge of pulse 45 of signal 40 (e.g., 4 microseconds between times $t_1$ and $t_2$). Switch 18 is closed in response to control signal 40 reaching a threshold voltage (e.g., pulse 43). The 4 microsecond delay between pulses 45 and 43 ensures that semiconductor device 16 is conducting and that relatively low on-state voltage drop 39 (e.g., usually less than 2.0 V) is between terminals 20 and 22 before switch 18 is closed.

The threshold voltage to close switch 18 (e.g., pulse 43 of control signal 42) can be quite large (e.g., over 20 volts). MEM switch 18 can close more quickly when higher voltages are provided to control terminal 26. Therefore, in situations where extremely high speeds are necessary, control circuit 12 can generate a pulse 43 on signal 42 with a voltage level of 600 V. A 600 V signal can be derived from other circuitry (not shown) in power application system 10. Preferably, signal 42 reaches approximately 20 to 40 V, and switch 18 can turn ON and OFF at a frequency of approximately 10 kilohertz.

When control circuit 12 determines that the path between terminals 20 and 22 should be open, control circuit 12 brings control signal 42 to a low voltage 38 V, such as, 0 volts, and opens MEM switch 18 at time $t_3$. Voltage 41 is raised to voltage drop 39 after switch 18 is opened. After MEM switch 18 is fully open, semiconductor device 16 is brought out of the conduction state by bringing control signal 40 to low voltage 38, e.g., 0 volts at time $t_4$. Control circuit 12 preferably brings signal 40 to 0 volts 2–10 microseconds after pulse 43 of signal 42 is completed. The 2–10 microsecond delay (preferably 4 microseconds) between trailing edges of pulses 43 and 45 (e.g., between times $t_3$ and $t_4$ ensures that switch 18 can be fully opened before voltage 41 reaches a high voltage level 37 between terminals 20 and 22.

System and application parameters can affect the voltages associated with switch 18 and the timing relationships between switch 18 and device 16. For example, a 200 V control signal for switch 18 (derived from a bus capacitor) can reduce the 4 microsecond delay. The specific voltage and timing examples given are preferred values only.

Alternatively, device 16 can be in a non-conducting state when switch 18 is conducting. In such a situation, circuit 12 reapplies pulse 45 before switch 18 is opened or otherwise ensures that a relatively low voltage drop is across switch 18. In this alternative, signal 40 can have two pulses similar to pulse 45 for each pulse 43 of signal 42. A relatively low voltage drop can be any voltage drop which is low enough to prevent damage to switch 18 due to high voltages across switch 18. Arcing associated with high voltages can reduce the operating life of switch 18.

Control circuit 12 can generate control signals 40 and 42 and pulses 43 and 45 in response to various control criteria. For example, a motor control algorithm in control circuit 12 can respond to torque and speed inputs when generating control signals 40 and 42. Alternatively, control circuit 12 can operate in accordance with power conversion algorithms or other control algorithms.

Control circuit 12 can also measure voltage 41 across terminals 20 and 22, or currents through devices 16 and 18, to determine when pulses 43 and 45 should be produced. For example, in a rectifying application, circuit 12 can sense a change of direction of current through switch 18, or a change of voltage across switch 18, to open and to close switch 18 in accordance with rectification operations and with low voltages across switch 18. If circuit 12 implements a control algorithm in which switch 18 only must be switched when a relatively low voltage is across switch 18, then device 16 can be eliminated from apparatus 14. Circuit 12 can be an analog or digital circuit which implements the described operation of switch 18. Circuit 12 can include operational amplifiers, current sensors, voltage sensors, microcontrollers, programmable logic devices, ASICs, microprocessors, or other circuitry.

Although semiconductor devices 16 and MEM switch 18 are discussed as normally opened or as enhancement mode devices, semiconductor device 16 and MEM switch 18 can also be operated as normally closed switches or as depletion mode devices. MEM switch 18 can be designed so that it is open in response to pulse 43. The particular operational voltages and timing examples given are not shown in a limiting fashion.

Semiconductor devices 16 can be configured to have low switching losses at the expense of high conduction losses. The total power loss associated with apparatus 14 is minimal because the switching losses associated with device 16 are optimized, and the conduction losses associated with device 16 are drastically reduced by the short-circuit action of switch 18.

A more detailed description of a preferred exemplary operation of apparatus 14 is discussed below as follows. Semiconductor device 16 is preferably continuously conducting when MEM switch 18 is opened or closed due to the relationship between control signals 40 and 42. Therefore, the voltage across terminals 20 and 22 is always relatively small (e.g., on-state voltage drop 39 associated with semiconductor device 16) when MEM switch 18 is actuated. When MEM switch 18 is closed, voltage 41 across terminals 20 and 22 is advantageously decreased even further. In a typical example, the resistance between terminals 20 and 22 can be less than 0.576 microohms (m$\Omega$). In contrast to semiconductor device 16, which would typically dissipate over 30 watts at 15 amps of current in a conduction mode, MEM switch 18 can advantageously dissipate only 0.13 watts. Thus, MEM switch 18 drastically reduces conduction losses associated with power application system 10 (e.g., conduction power losses can be decreased over 200 times).

Figure 4:
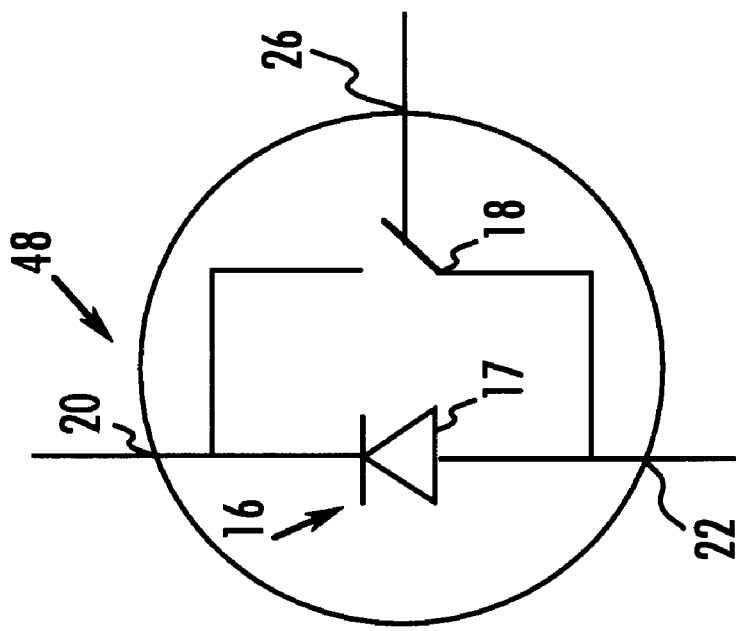
FIG. 4 is an electrical schematic circuit symbol of the semiconductor device and MEM switch illustrated in FIG. 1, wherein the semiconductor device is a diode.
Figure 3:
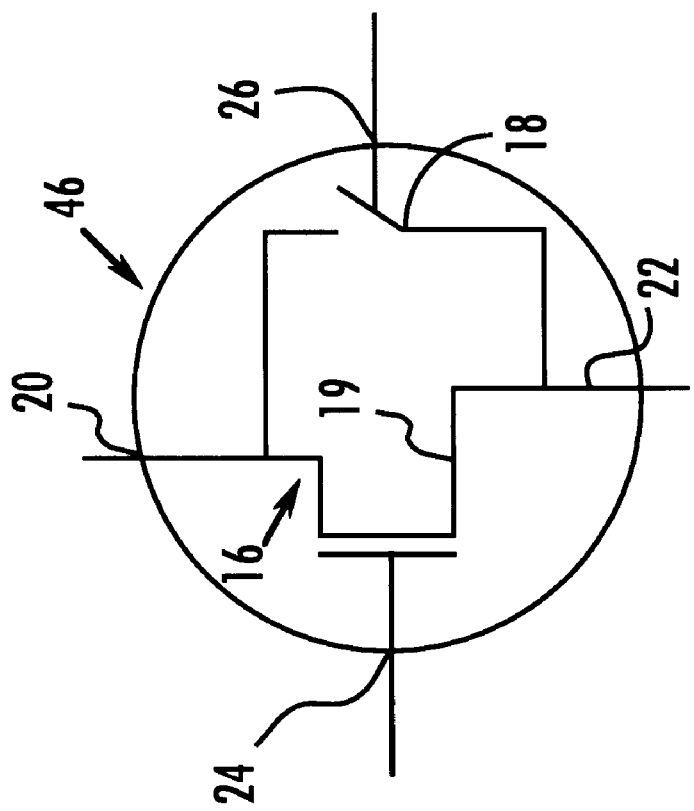
FIG. 3 is an electrical schematic circuit symbol for the semiconductor device and MEM switch illustrated in FIG. 1, wherein the semiconductor device is a semiconductor switch.

With reference to FIGS. 3 and 4, circuit schematic symbols are shown for apparatus 14. circuit symbol or device 46 represents an apparatus 14, wherein semiconductor device 16 is a switched semiconductor device 19, such as, a thyristor, an SCR, an IGBT, a FET, or a bipolar transistor. Circuit symbol or device 48 represents apparatus 14, wherein semiconductor device 16 is a diode 17 or other two-terminal semiconductor device. Devices 46 and 48 only indicate that device 16 and switch 18 are present in a parallel configuration and do not necessarily represent that device 16 and switch 18 are part of a single package or substrate. Device 46 includes a semiconductor control terminal 24 and a MEM switch control terminal 26. Device 48 includes a MEM switch control terminal 26.

As discussed with reference to FIG. 1, apparatus 14 and device 46 can be configured to include one control terminal input and an internal control circuit that generates control signals 40 and 42 in response to a single external control signal. Also, an internal control circuit can be provided to internally generate signals 40 and 42 in response to current and voltage measurements through and across device 16 and switch 18. Such a technique is particularly advantageous in rectifying operations where signals 40 and 42 can be generated in response to the direction of current through apparatus 14 or to voltage across apparatus 14. Alternatively, timing or other relationships could be utilized to generate signals 40 and 42.

Figure 5:
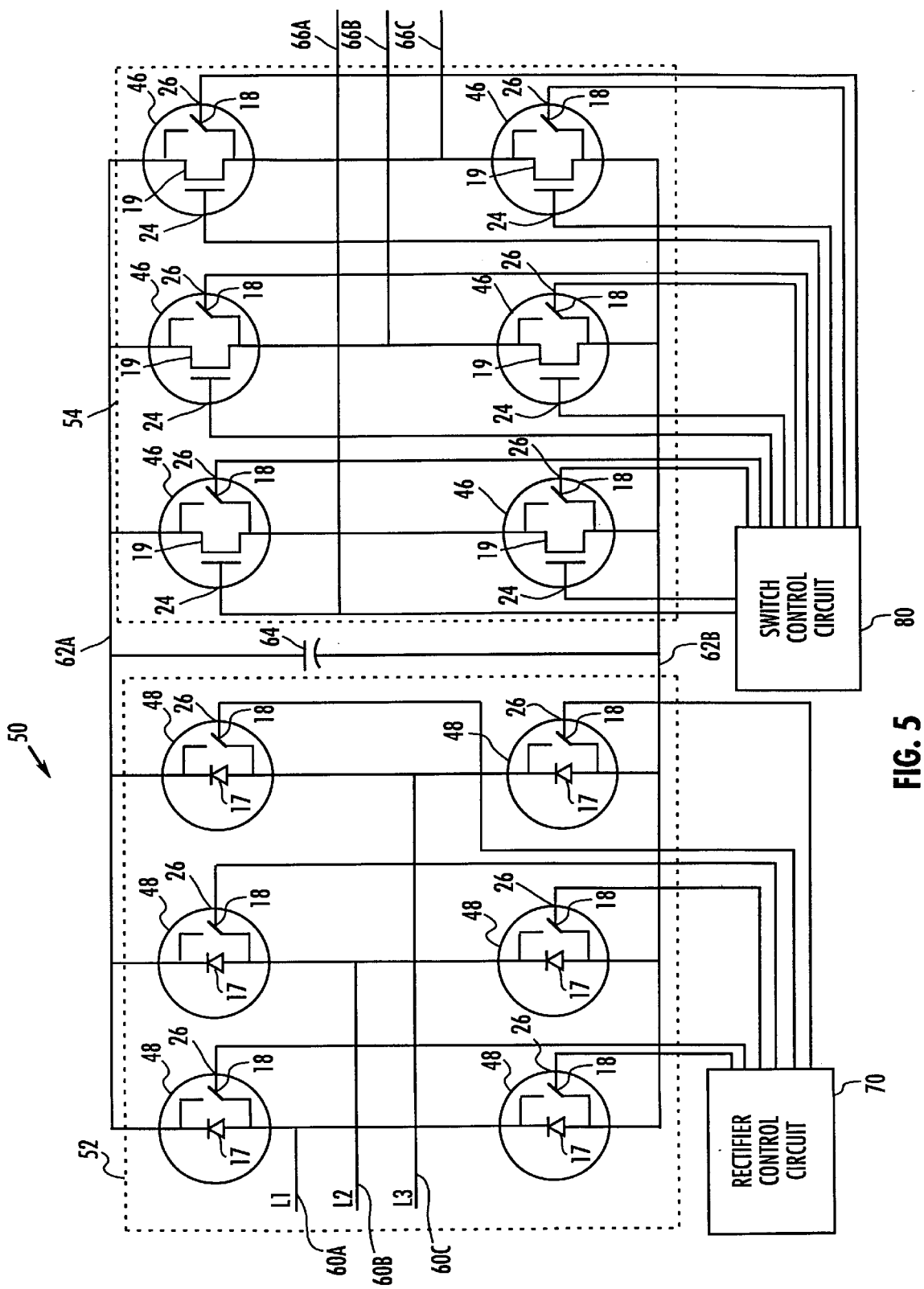
FIG. 5 is an electrical schematic block diagram of a power application circuit configured as a three-phase AC to AC motor controller, in accordance with another exemplary embodiment of the present invention.

With reference to FIG. 5, an AC to AC motor control circuit 50 includes a rectifying circuit 52 and a switching circuit 54. Rectifying circuit 52 includes six devices 48 which are coupled to power input conductors 60A, 60B, and 60C and which provide DC power to conductors 62A and 62B. Conductors 60A–C can receive three phase AC power at 120, 230, 460, or 575 V or higher. Conductors 62A and 62B are coupled to a capacitor 64. Conductors 62A and 62B provide a DC power input (e.g., a power signal from 120 to 600 V) for switching circuit 54.

Switching circuit 54 includes six devices 46 arranged to convert the signal provided at conductors 62A and 62B to an output signal provided at conductors 66A, 66B, and 66C. Devices 48 in rectifier circuit 52 are controlled by a rectifier control circuit 70. Similarly, devices 46 are controlled by a switch control circuit 80. Control circuits 70 and 80 coordinate the opening and closing of switches 18 in a manner similar to the operation of control circuit 12, as discussed with reference to FIG. 1.

Rectifier control circuit 70 closes switch 18 of devices 48 when diode 17 (FIG. 4) is in a forward conduction state. Circuit 70 preferably provides a control signal similar to control signal 42 (FIG. 2) to control terminal 26 so switch 18 is only opened and closed when the voltage across device 48 is below a threshold (such as, a diode voltage drop 0.7 V). Control circuit 70 can utilize either current measurement circuits or voltage measurement circuits to determine when the voltage drop across devices 48 is appropriate to close switch 18.

Alternatively, devices 48 can be replaced solely by switch 18, which is only opened and closed when the signal across switch 18 is approximately 0 volts. Circuit 70 can monitor the voltage and current on conductors 60A–C or can utilize a timing circuit to appropriately open and close switch 18.

Switch control circuit 80 controls semiconductors switches 19 (FIG. 3) of devices 46 as well as switches 18. Circuit 80 controls devices 46 so that power from conductors 62A and B is appropriately provided to conductors 66A–C. Control circuit 80 ensures that switch 18 is only opened and closed when its associated semiconductor device 19 is in a conduction state or when there is a low voltage across switch 18.

Motor control circuit 50 operates as a power conversion circuit. Rectifier circuit 52 can be replaced by an ordinary rectification circuit utilizing diodes, SCRs, or other semiconductor switches. Switching circuit 54 can be replaced by an ordinary switching circuit utilizing ordinary unidirectional or bidirectional semiconductor switches.

Figure 6:
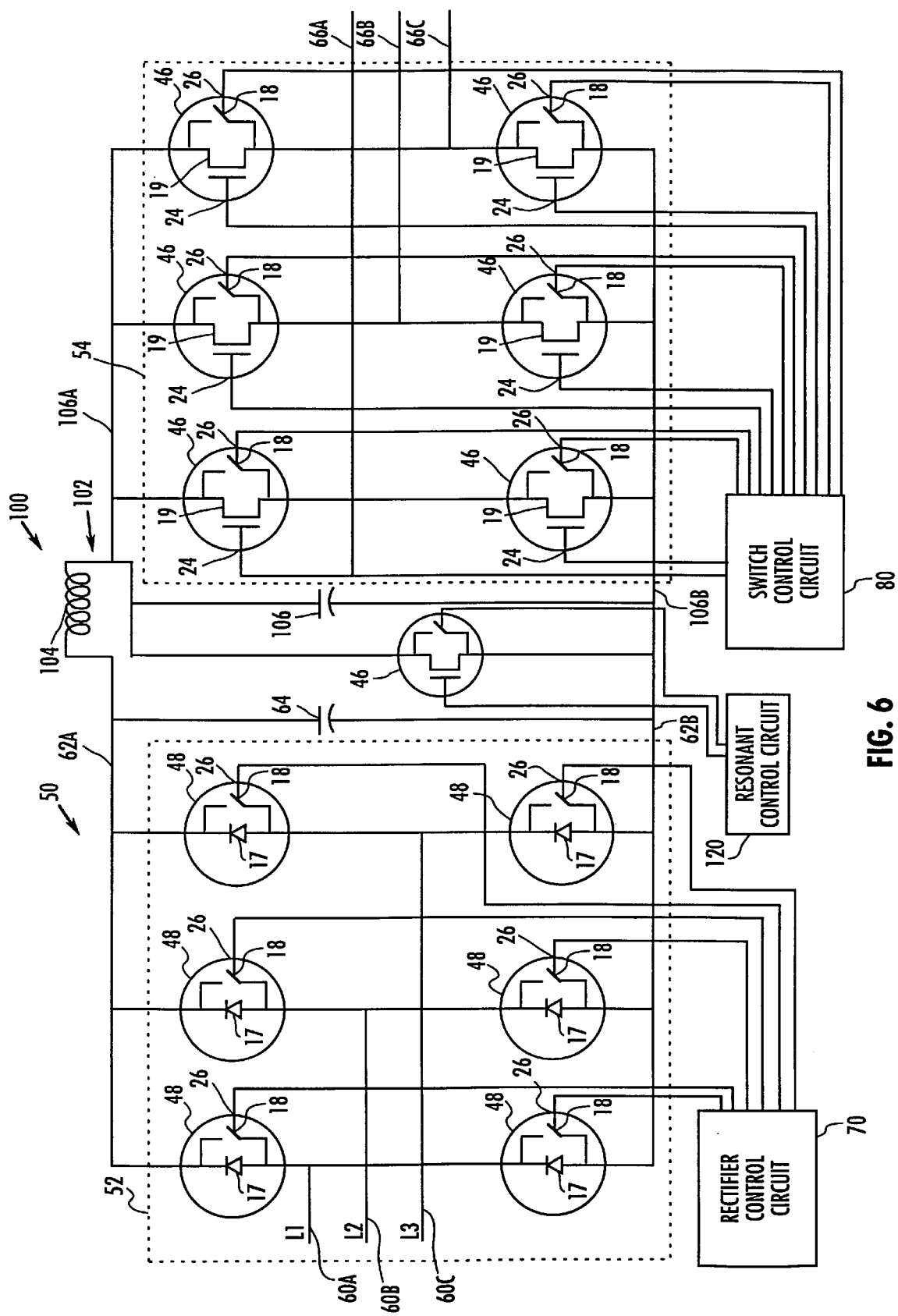
FIG. 6 is an electrical schematic block diagram of a power application circuit configured as a resonance motor controller, including MEM switches, in accordance with yet another exemplary embodiment of the present invention.

With reference to FIG. 6, a resonant motor control circuit 100 is similar to motor control circuit 50, discussed with reference to FIG. 5, except circuit 100 includes a resonant circuit 102 and a resonant control circuit 120. Circuit 102 includes an inductor 104, a capacitor 106, and device 46. Alternatively, device 46 can be replaced by any type of switch. Circuit 100 is an example of a resonant motor control system.

Figure 7:
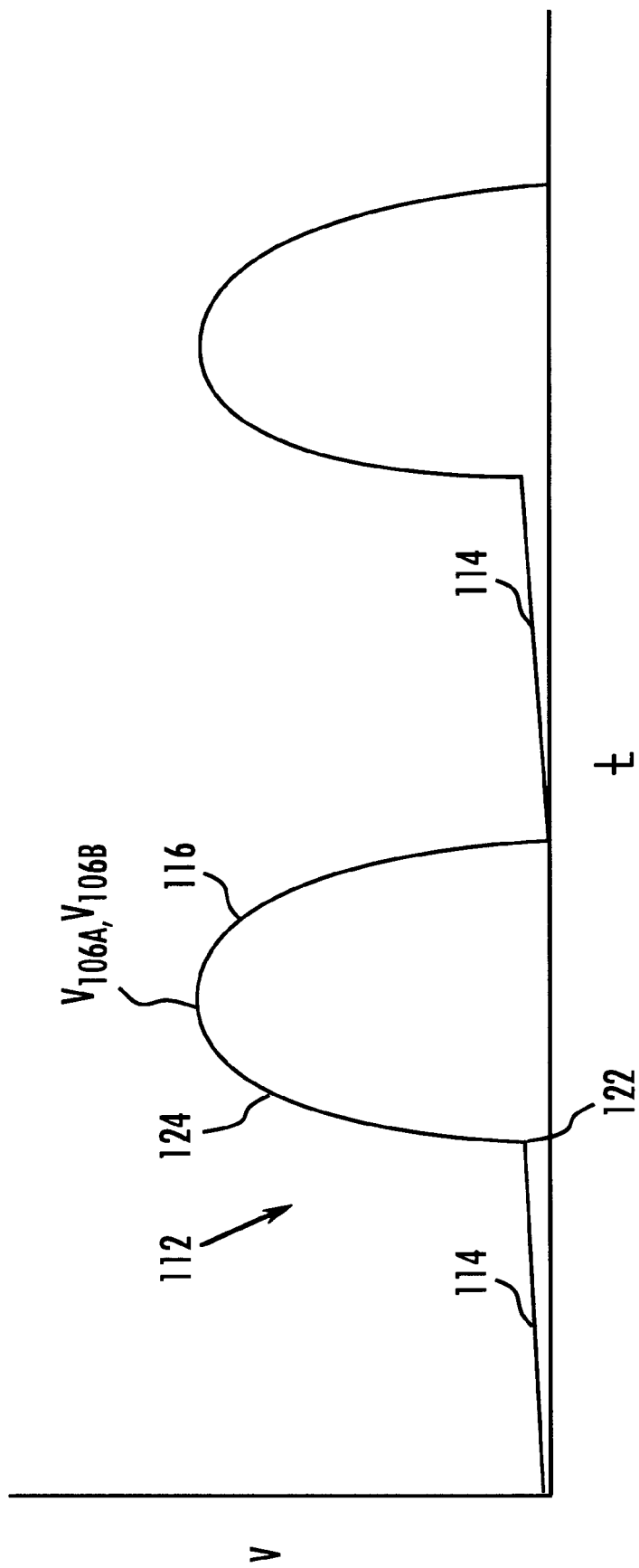
FIG. 7 is a timing diagram illustrating the power signal provided to MEM switches in the resonant motor controller illustrated in FIG. 6.

With reference to FIGS. 6 and 7, circuit 102 operates to convert the DC power signal on conductors 62A–B to a resonance power signal 112 (FIG. 7). Signal 112 has a low voltage or zero-voltage portion 114 and a signal voltage portion 116. Portion 114 has a relatively low peak voltage (e.g., within several volts of zero volts) when compared to portion 116.

Circuit 102 is coupled to resonant control circuit 120. Control circuit 120 controls device 46 in circuit 102 so that signal 112 is created between conductors 106A and B. Device 46 is closed by circuit 120 to discharge capacitor 106 and to reduce the voltage across conductors 106A and 106B to approximately 0 (e.g., portion 114 of signal 112). At a time 122 (FIG. 7), control circuit 120 opens device 46 so capacitor 106 is charged. The charging of capacitor 106 forms a rising edge 124 of portion 116 of signal 112. Circuit 102 thereafter resonates to form signal 112 based upon the manipulation of device 46 by circuit 120. Alternatively, device 46 in circuit 102 can be replaced by a conventional switching device.

Control circuit 80 preferably coordinates the operation of devices 46 in switching circuit 54 so that they are opened and closed during the low voltage portion 114 of signal 112. In this way, both semiconductor devices 19 and switches 18 do not switch during high voltages between conductors 106A and 106B. In such an embodiment, switches 18 can be utilized without semiconductor devices 19, if switches 18 are only opened and closed during the low voltage portion 114 of signal 112. In other words, a sole switch 18 which receives signal 112 can replace device 46 if switch 18 is only turned on and off during low voltage portion 114 of signal 112. Further, switching losses associated with device 19 and switches 18 are advantageously reduced by only switching during the low voltage portion 114 of signal 112. Also, arcing in switches 18 is also reduced by this method, thereby increasing the lifetime of switches 18.

Alternatively, various types of resonant circuit 102 can be utilized. For example, parallel resonance circuits can be utilized. Further, devices 46 in switching circuit 54 can operate to discharge capacitor 106 under an appropriate control scheme, instead of utilizing device 46 in circuit 102.

Figure 8:
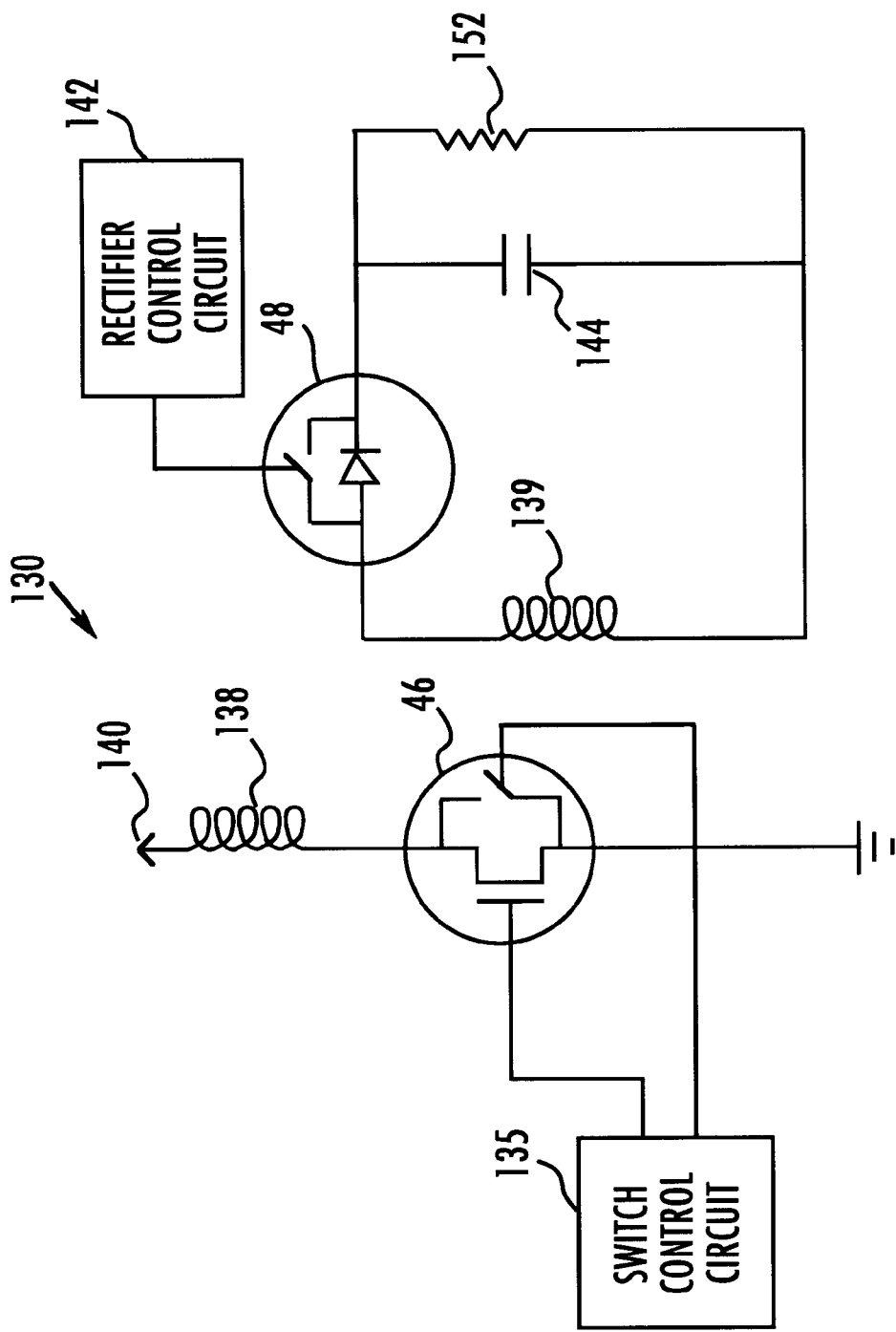
FIG. 8 is an electrical schematic block diagram of a power application circuit configured as a DC to DC power converter, in accordance with still another exemplary embodiment of the present invention.

With reference to FIG. 8, a DC to DC power conversion circuit 130 includes a switch control circuit 135, device 46, a primary transformer coil 138, a secondary transformer coil 139, a DC power supply 140, device 48, a rectifier control circuit 142, a capacitor 144, and a resistor 152. Switch control circuit 135 operates to provide a pulsing or AC signal through coil 138. A transformed DC pulsing or AC signal is generated in coil 139, which is rectified by device 48. Switch control circuit 135 and rectifier control circuit 142 are similar to control circuits 80 and 70, respectively, discussed with reference to FIG. 5, except that circuits 135 and 142 are configured to perform a DC to DC power conversion operation. Alternatively, circuit 130 can be configured for DC to DC conversion in a variety of fashions and can include devices 46 and 48 for switching and rectifying operations.

Figure 9:
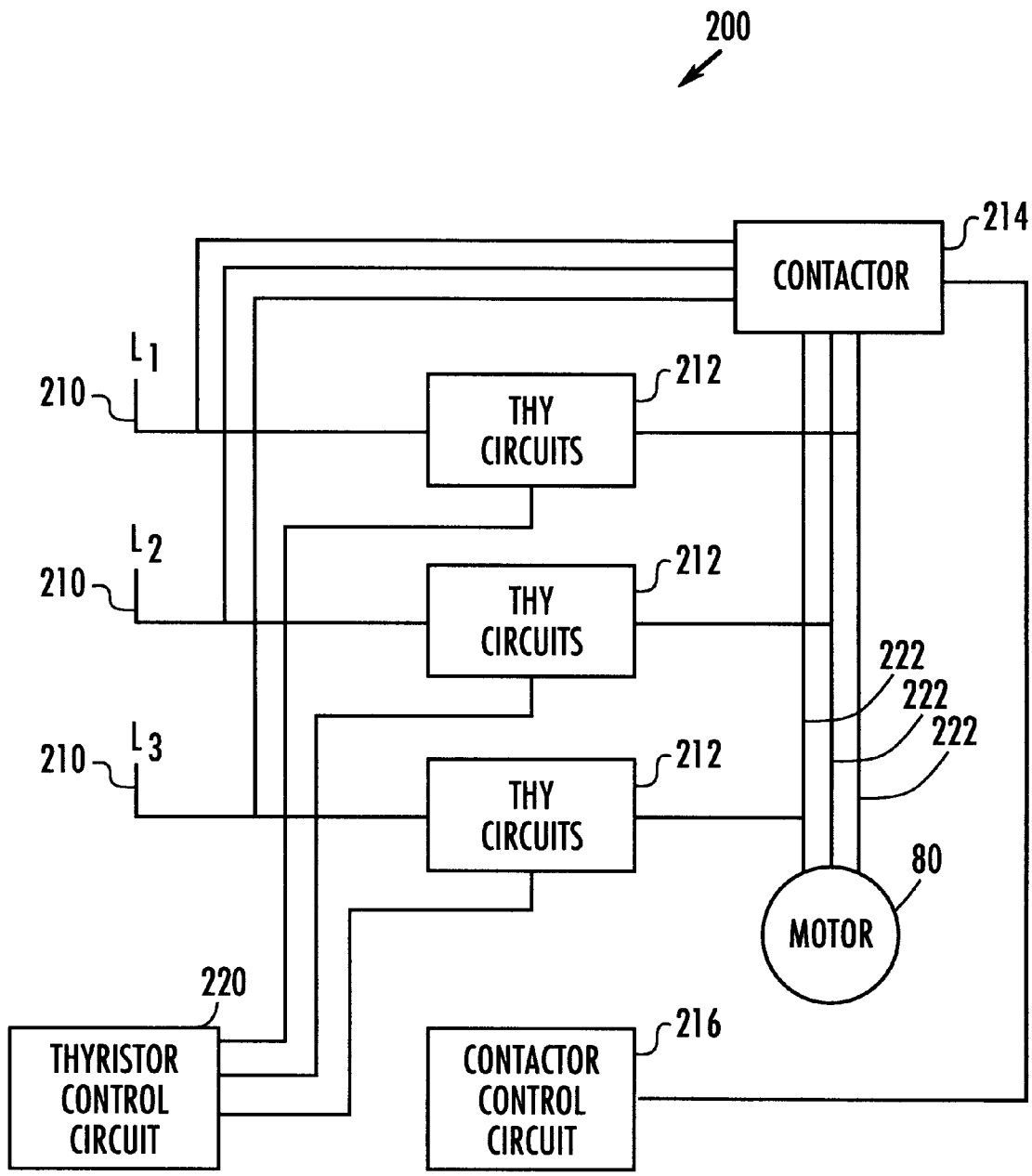
FIG. 9 is a schematic block diagram of a power application circuit configured as a matrix converter, in accordance with a further exemplary embodiment of the present invention.

With reference to FIG. 9, an AC motor drive 200 includes three-phase AC input conductors 210, thyristor circuits 212, a contactor 214, a contactor control circuit 216, a thyristor control circuit 220, and output conductors 222. Control circuit 220 operates to open and close devices 46 (not shown) located in thyristor circuits 212. In drive 200, semiconductor devices 19 in devices 46 are preferably SCRs. Once a motor 80, which is coupled to output conductors 222, is ramped up to a run mode speed by providing power through circuits 212, circuit 216 closes contactor 214 to directly couple conductors 210 to output conductors 222. Power loss associated with thyristor circuits 212 is limited by utilizing devices 46 (not shown in FIG. 9) that are controlled by control circuit 220.

Figure 10:
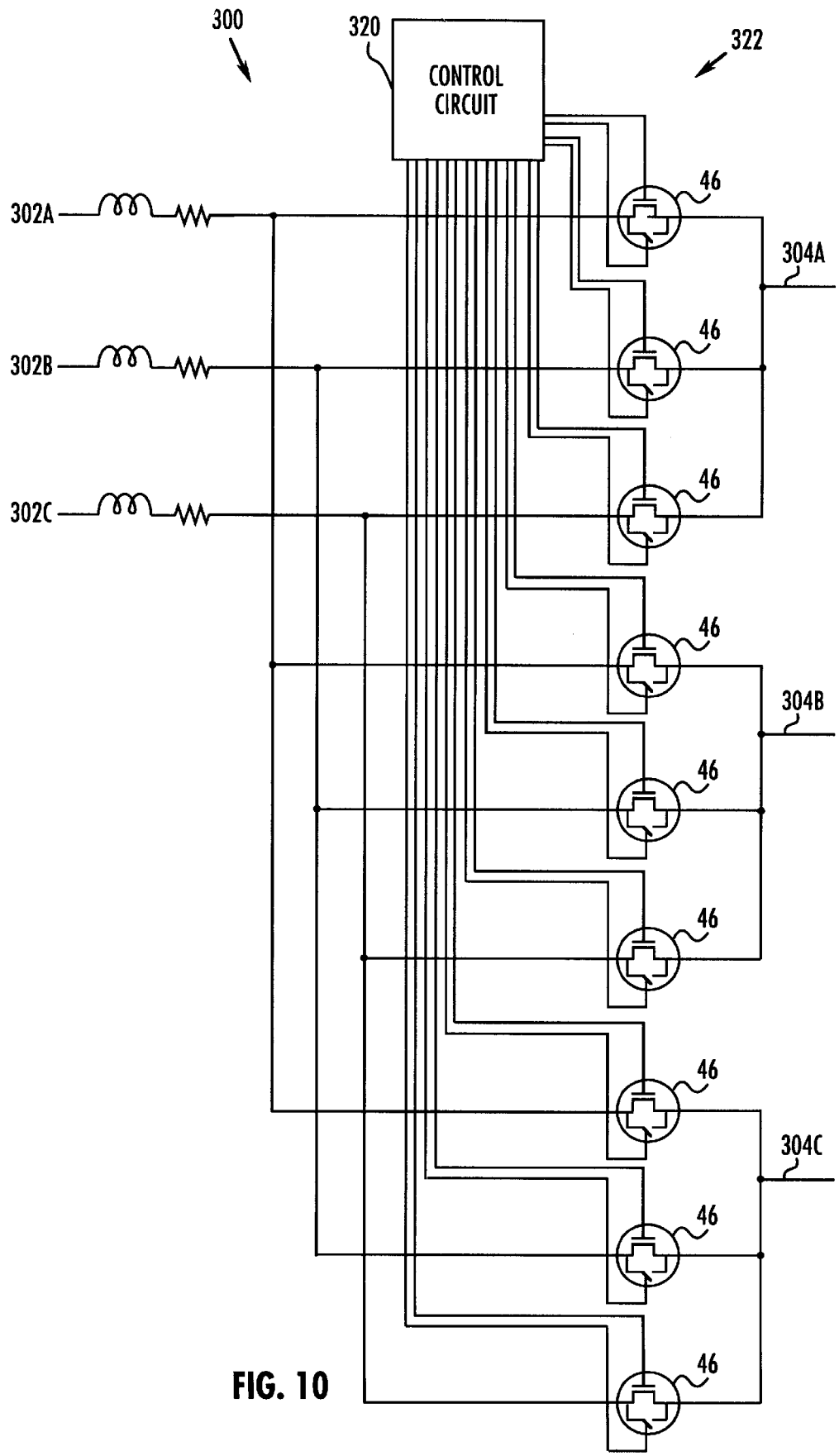
FIG. 10 is a general block diagram of a motor controller similar to the motor controller illustrated in FIG. 5, in accordance with yet a further exemplary embodiment of the present invention.

With reference to FIG. 10, a matrix converter circuit 300 includes three input conductors 302A, 302B, and 302C coupled to an array 322 of nine devices 46. Devices 46 are coupled to a control circuit 320. Semiconductor switch 19 of devices 46 is preferably a bidirectional IGBT. Alternatively, semiconductor device 19 of devices 46 can be two semiconductor switches, such as, unidirectional IGBTs configured to conduct current and to block voltage in both directions.

Control circuit 320 causes array 322 of devices 46 to perform direct AC to AC power conversion. System 300 is preferably configured as a three-phase matrix converter. Alternatively, system 300 can operate on any number of phases.

Control circuit 320 operates a control algorithm to ensure that devices 46 are opened and closed at the appropriate times to perform the matrix conversion operation. Additionally, control circuit 320 ensures that switches 18 of devices 46 are only opened and closed when a low voltage is across switches 18. Switches 18 are ideal bidirectional switches, especially for matrix inverter applications.

Figure 11:
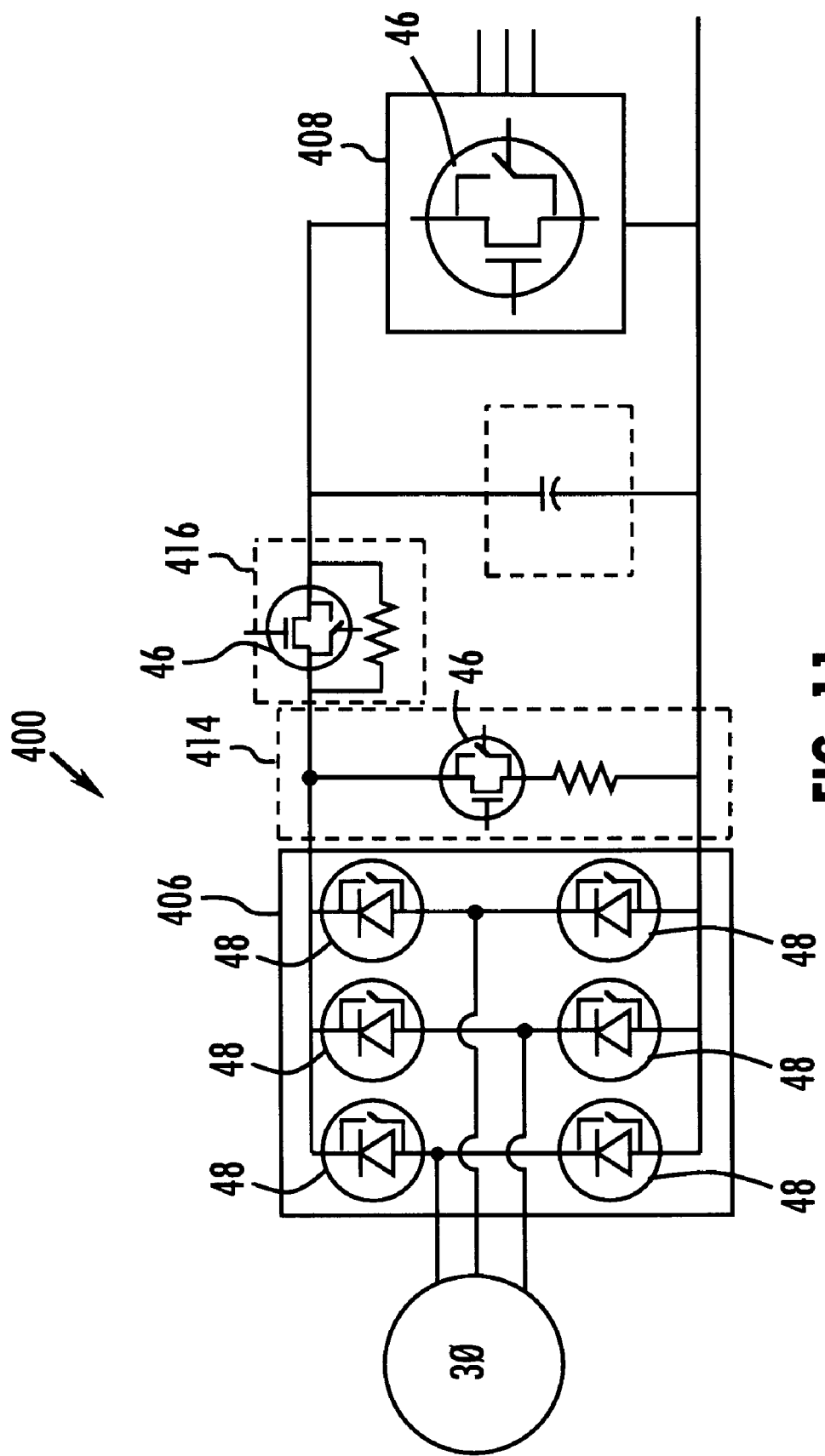
FIG. 11 is an exemplary block diagram of a motor controller, including precharge circuits and dynamic braking circuits, in accordance with an even still further exemplary embodiment of the present invention.

With reference to FIG. 11, a three-phase AC motor drive system 400 includes a rectifier circuit 406, similar to rectifying circuit 52 (FIG. 5), and a switching circuit 408, similar to switching circuit 54 (FIG. 5). Additionally, system 400 includes a dynamic brake circuit 414 that has device 46 and a precharge circuit 416 with device 46. Devices 46 in circuit 414 and 416 are preferably controlled by a control circuit which controls devices 46 to appropriately precharge and to dynamically brake a motor coupled to switching circuit 408.

Figure 12:
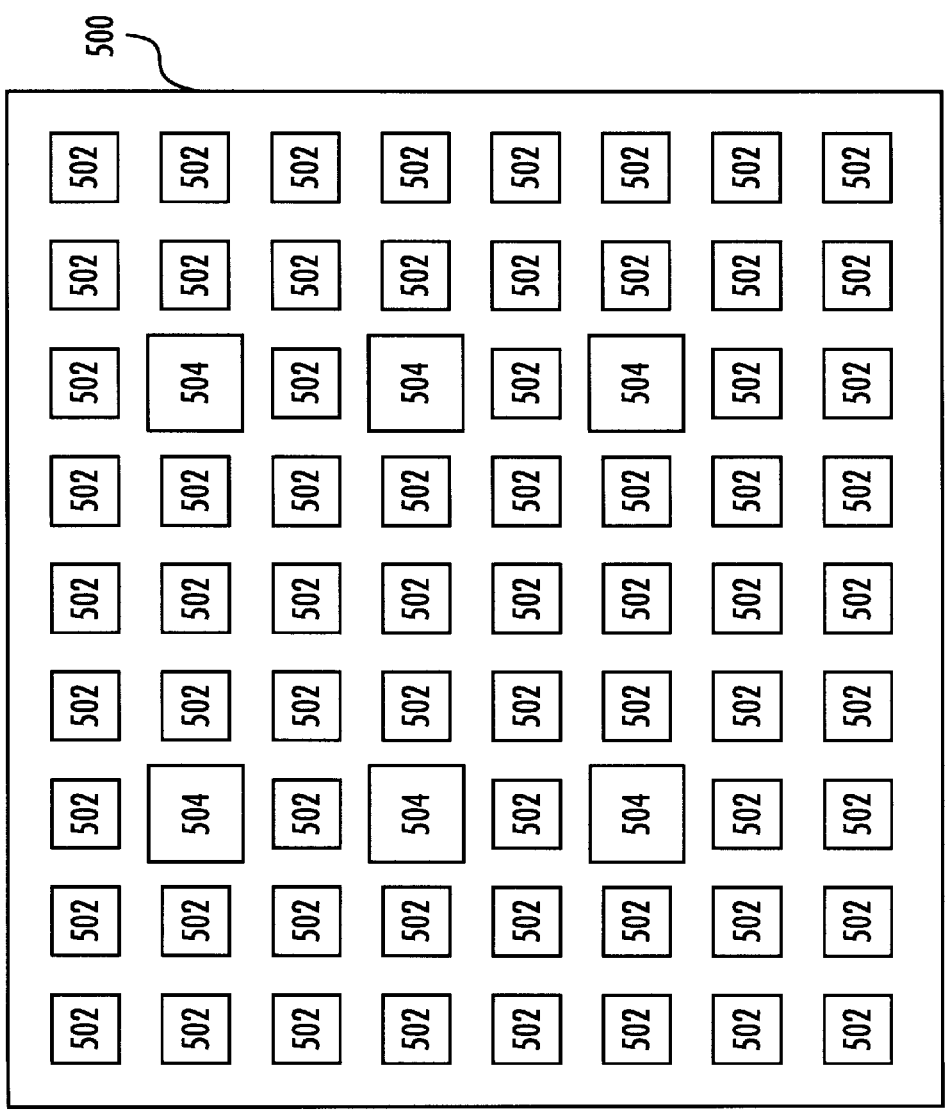
FIG. 12 is a schematic block diagram of an MEM switch and semiconductor device disposed on a single semiconductor substrate, in an even further exemplary embodiment of the present invention.

With reference to FIG. 12, an integrated circuit package 500 includes an array of IGBT cells 502 and MEM switch cells 504. Package 500 includes 66 IGBT cells 502 and six MEM cells 504. Cells 504 are larger than cells 502, and they have significantly more current capacity than cells 502. Arrays of MEM switch cells 504 greatly increase the current rating while keeping each cell 504 very small, thereby maintaining package 500 very small.

Package 500 may include a diode rather than an IGBT, wherein cells 502 are replaced with diode cells. Alternatively, a package can be designed wherein a wafer has a first layer of diodes and a second layer of MEM devices. The simpler fabrication requirements associated with a diode, such as, a free-wheeling diode which is almost always used with an IGBT, can make package 500 easier to fabricate. Cells 502 and 504 can be provided on a single semiconductor substrate. Alternatively, cells 502 can also be replaced with SCR cells.

By irradiating cells 502 or doping the epitaxial layers associated with cells 502 to reduce the lifetime of charge carriers, cells 502 are preferably optimized to have low switching losses. Although cells 502 have higher conduction losses, cells 504 short-out cells 502 when they are conducting, as discussed with reference to FIG. 1, thereby reducing conduction losses.

It is understood that, while the detailed drawings, specific examples, and particular component values given describe preferred embodiments of the present invention, they are for the purpose of illustration only. The apparatus and method of the invention is not limited to the precise details and conditions disclosed. For example, although various semiconductor switch types are discussed, the MEM switch can be utilized with any type of semiconductor. Further still, although a particular package design is shown in FIG. 12, various other package designs could be utilized without departing from the scope of the invention. Thus, changes may be made to the details disclosed without departing from the spirit of the invention, which is defined by the following claims.

What is claimed is:

1. A power conversion circuit, comprising:
   an array of microelectromechanical switches having a power input and a power output, each of the switches having an input signal terminal, an output signal terminal, and a control terminal; and
   a control circuit coupled to the array of switches, the control circuit providing a control signal to the control terminal of each of the switches in the array, the control circuit controlling operation of the switches, each of the switches electrically connecting the input signal terminal to the output signal terminal in response to the control signal provided by the control circuit, wherein the input signal terminal and the output signal terminal of the microelectromechanical switches are connected and disconnected when a low voltage exists across the input signal terminal and the output signal terminal, whereby the array of the switches converts a power signal provided to the power input and provides a converted power signal at the power output.

2. The power conversion circuit of claim 1, wherein the array of switches is arranged as a matrix power converter.

3. The power conversion circuit of claim 1, wherein the array of switches is arranged as a direct current to alternating current converter.

4. The power conversion circuit of claim 2, wherein the array of switches is arranged as a motor controller for providing a pulse width modulated power signal at the power output.

5. The power conversion circuit of claim 4, wherein the array further comprises a semiconductor device in parallel with each of the switches.

6. The power conversion circuit of claim 5, wherein the semiconductor device can be an IGBT, an SCR, a diode, a power FET, or a bipolar transistor.

7. The power conversion circuit of claim 5, wherein the control signal is provided to close and open the switch when a low voltage drop is across the semiconductor device.

8. A power conversion circuit, comprising:
   a semiconductor device;
   a microelectromechanical switch coupled in parallel with the semiconductor device; and
   a control circuit coupled to the microelectromechanical switch, the control circuit opening and closing the switch when a magnitude of voltage across the switch meets a predetermined condition, whereby arcing in the microelectromechanical switch is reduced.

9. The power application circuit of claim 8, wherein the semiconductor device and the microelectronic switch are coupled to provide a rectification circuit.

10. The power application circuit of claim 8, wherein the semiconductor device and the microelectronic switch are coupled to provide a direct current to alternating current conversion circuit.

11. The power application circuit of claim 8, wherein the semiconductor device and microelectronic switch are coupled to provide a direct current to direct current conversion circuit.

12. The power application circuit of claim 8, wherein the semiconductor device and the microelectronic switch are coupled to provide an alternating current to alternating current conversion circuit.

13. The power application circuit of claim 8, wherein the semiconductor device and the microelectronic switch are coupled to provide a motor control circuit.

14. A method of reducing conduction losses in a power application circuit including a power semiconductor device and a microelectromechanical system switch in parallel with the power semiconductor device, the method comprising:

closing the switch when a magnitude of voltage across the semiconductor device is below a threshold; and opening the switch before the magnitude of the voltage across the switch rises above the threshold.

15. The method of claim 14, wherein the threshold is 5 volts.

16. The method of claim 14, wherein the semiconductor device is a diode.

17. The method of claim 14, wherein the semiconductor device has a semiconductor control terminal, and the semiconductor device is an IGBT, an SCR, a power FET, or a bipolar transistor.

18. The method of claim 17 further comprising:

providing a semiconductor signal to the semiconductor control terminal to cause the semiconductor device to conduct before closing the switch.

19. The method of claim 18 further comprising:

maintaining the semiconductor signal at the semiconductor control terminal until the opening the switch step is completed.

20. The method of claim 14 further comprising:

sampling current through the semiconductor device to determine when to open and to close the switch.

21. An integrated circuit package including a semiconductor device, a first terminal, a second terminal, and a microelectromechanical switch, the switch being coupled between the first terminal and the second terminal, the semiconductor device being coupled between the first terminal and the second terminal, the switch being controlled by a switch control signal, whereby the switch reduces the conduction losses associated with the semiconductor device.

22. The integrated circuit package of claim 21, wherein the switch and the semiconductor device are integrated on the same semiconductor substrate.

23. The integrated circuit package of claim 21 further comprising a control circuit coupled to the switch, the control circuit generating the switch control signal.

24. The integrated circuit of claim 23, wherein the control circuit provides the switch control signal so the switch is opened and closed when a magnitude of a voltage drop across the switch is below a threshold.

25. The integrated circuit of claim 24, wherein the semiconductor device includes a semiconductor control terminal, and the control circuit provides a semiconductor control signal to the semiconductor device to cause the semiconductor device to conduct, wherein the switch control signal is provided after the semiconductor control signal is provided and is removed before the semiconductor control signal is removed.

26. The integrated circuit package of claim 25 further comprising a control terminal coupled to the control circuit, wherein the control circuit provides the switch control signal on the semiconductor control signal in response to an external control signal at the control terminal.

27. The integrated circuit package of claim 21, wherein the semiconductor device is a diode, as IGBT, an SCR, a power FET, or a bipolar transistor.

28. The integrated circuit package of claim 21, wherein the semiconductor device is configured to reduce a lifetime of charge carriers to reduce switching losses in the semiconductor device.

29. The integrated circuit package of claim 28, wherein the semiconductor device is an IGBT, the IGBT being configured by doping or radiation to reduce the lifetime of the charge carriers.

30. The integrated circuit package of claim 21, wherein the semiconductor device is an IGBT including a gate input, wherein the gate input receives a gate control signal causing the IGBT to conduct, the gate control signal being provided before the switch control signal is provided and maintained until after the switch control signal is removed.

31. A rectifier circuit, comprising:

a power input;

at least one semiconductor device coupled to the power input, the semiconductor device rectifying a power signal at the power input;

a microelectromechanical switch coupled in parallel with the semiconductor device, the microelectromechanical switch including a control input; and a control circuit coupled to the control input and providing a control signal to the control input, the control circuit providing the control signal to the control input so the switch is opened and closed when a magnitude of voltage across the switch is below a threshold.

32. The rectifier circuit of claim 31, wherein the control circuit senses current through either the semiconductor device, the switch, or both the switch and the semiconductor device, and provides the control signal in response to the current.

33. The rectifier circuit of claim 32, wherein the control circuit provides the control signal to open and to close the switch when the current transitions from a first direction to a second direction.

34. A motor control circuit, comprising:

a power input;

a power output;

at least one semiconductor device coupled to the power input, the semiconductor device applying a power signal at the power input to the power output;

a microelectromechanical switch coupled in parallel with the semiconductor device; and a switch control circuit coupled to the switch, the switch control circuit opening and closing the switch when a magnitude of voltage across the switch is below a threshold.

35. The motor control circuit of claim 34 further comprising:

a power conductor;

a rectifier circuit coupled to the power conductor, the rectifier circuit including at least one rectifying semiconductor device and a rectifier microelectromechanical switch coupled in parallel with the semiconductor device, the rectifier circuit providing the power signal at the power input; and a rectifier control circuit opening and closing the rectifier microelectronic switch when a magnitude of voltage across the rectifier microelectronic switch is below a threshold.

36. A motor control circuit, comprising:

a power input;

a power bus;

a resonant circuit coupled to the power input, the resonance circuit providing a power signal to the power bus, the power signal having a signal voltage portion and a low voltage portion;

a power output;

a plurality of motor control microelectromechanical switches coupled to the power bus; and a control circuit coupled to the motor control microelectromechanical switches, the control circuit opening and closing the switches during the low portion of the power signal.

37. The motor control circuit of claim 36, wherein the resonance circuit includes a semiconductor device and a second microelectromechanical switch coupled in parallel with the semiconductor device.

38. The motor control circuit of claim 37, wherein the second microelectromechanical switch is opened and closed when a magnitude of voltage across the second microelectronic switch is below a threshold.

39. The motor control circuit of claim 38, wherein the second microelectromechanical switch is closed when the semiconductor device is conducting and is opened when the semiconductor device is conducting.

40. A power application device, comprising a microelectromechanical switch having an input, an output, a control terminal, and a control circuit coupled to the control terminal, the control circuit providing a control signal to the control terminal to open and to close a circuit path between the input and the output, the control circuit providing the control signal so the switch is opened and closed when a voltage below a threshold level is across the input and the output.

41. A power application circuit, comprising:

a power source providing an at least 24 volt input signal at a frequency below 500 hertz;

an electromechanical switch coupled to the power source, the electromechanical switch being in electrical communication with the power source and providing an at least 24 volt output signal at a frequency of at least 1,000 hertz wherein the electromechanical switch is only opened and closed when a low voltage is across the switch.

42. The power application circuit of claim 41, wherein the electromechanical switch is a MEM switch.

* * * * *